US012810922B2

(12) United States Patent
Morzano

(10) Patent No.: US 12,810,922 B2
(45) Date of Patent: Nov. 24, 2026

(54) SENSE AMP BALANCING COMPONENT

(71) Applicant: Micron Technology, Inc., Boise, ID (US)

(72) Inventor: Christopher Morzano, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 146 days.

(21) Appl. No.: 18/788,961

(22) Filed: Jul. 30, 2024

(65) Prior Publication Data

US 2026/0038579 A1 Feb. 5, 2026

(51) Int. Cl.
*G11C 11/4091* (2006.01)
*G11C 5/06* (2006.01)
*G11C 11/4094* (2006.01)

(52) U.S. Cl.
CPC .......... *G11C 11/4091* (2013.01); *G11C 5/063* (2013.01); *G11C 11/4094* (2013.01)

(58) Field of Classification Search
CPC .................................................. G11C 11/4091
USPC .......................................................... 365/205
See application file for complete search history.

(56) References Cited

U.S. PATENT DOCUMENTS

| | | | | |
|---|---|---|---|---|
| 6,301,175 | B1 | 10/2001 | Seyyedy et al. | |
| 6,950,368 | B2 | 9/2005 | Morgan | |
| 7,002,862 | B2 | 2/2006 | Kang | |
| 9,042,190 | B2 | 5/2015 | Vimercati et al. | |
| 2011/0044121 | A1* | 2/2011 | Kim | G11C 11/4091 365/207 |
| 2019/0156869 | A1 | 5/2019 | Ingalls et al. | |
| 2020/0152249 | A1* | 5/2020 | Kawamura | G11C 7/12 |

* cited by examiner

*Primary Examiner* — Anthan Tran
(74) *Attorney, Agent, or Firm* — Brooks, Cameron & Huebsch, PLLC

(57) ABSTRACT

The present disclosure includes apparatuses and methods related to a sense amp balancing component in memory. An example apparatus can include a sense amp connected to a first digit line and a second digit line, and a controller configured to: send a first activation signal to the first digit line at a first time during a compensation window, and send a second activation signal to the second digit line at a second time during the compensation window, wherein the first time and the second time have a time difference that corresponds to a threshold voltage difference between the first digit line and the second digit line.

18 Claims, 6 Drawing Sheets

SENSE AMP BALANCING COMPONENT

TECHNICAL FIELD

The present disclosure relates generally to memory devices, and more particularly, to apparatuses and methods for a sense amp with a balancing component.

BACKGROUND

Memory devices are typically provided as internal, semiconductor, integrated circuits in computers or other electronic devices. There are many different types of memory including volatile and non-volatile memory. Volatile memory can require power to maintain its data and includes random-access memory (RAM), dynamic random access memory (DRAM), and synchronous dynamic random access memory (SDRAM), among others. Non-volatile memory can provide persistent data by retaining stored data when not powered and can include NAND flash memory, NOR flash memory, read only memory (ROM), Electrically Erasable Programmable ROM (EEPROM), Erasable Programmable ROM (EPROM), and resistance variable memory such as phase change random access memory (PCRAM), resistive random access memory (RRAM), and magnetoresistive random access memory (MRAM), among others.

Memory is also utilized as volatile and non-volatile data storage for a wide range of electronic applications. Non-volatile memory may be used in, for example, personal computers, portable memory sticks, digital cameras, cellular telephones, portable music players such as MP3 players, movie players, and other electronic devices. Memory cells can be arranged into arrays, with the arrays being used in memory devices.

DETAILED DESCRIPTION

Figure 1:
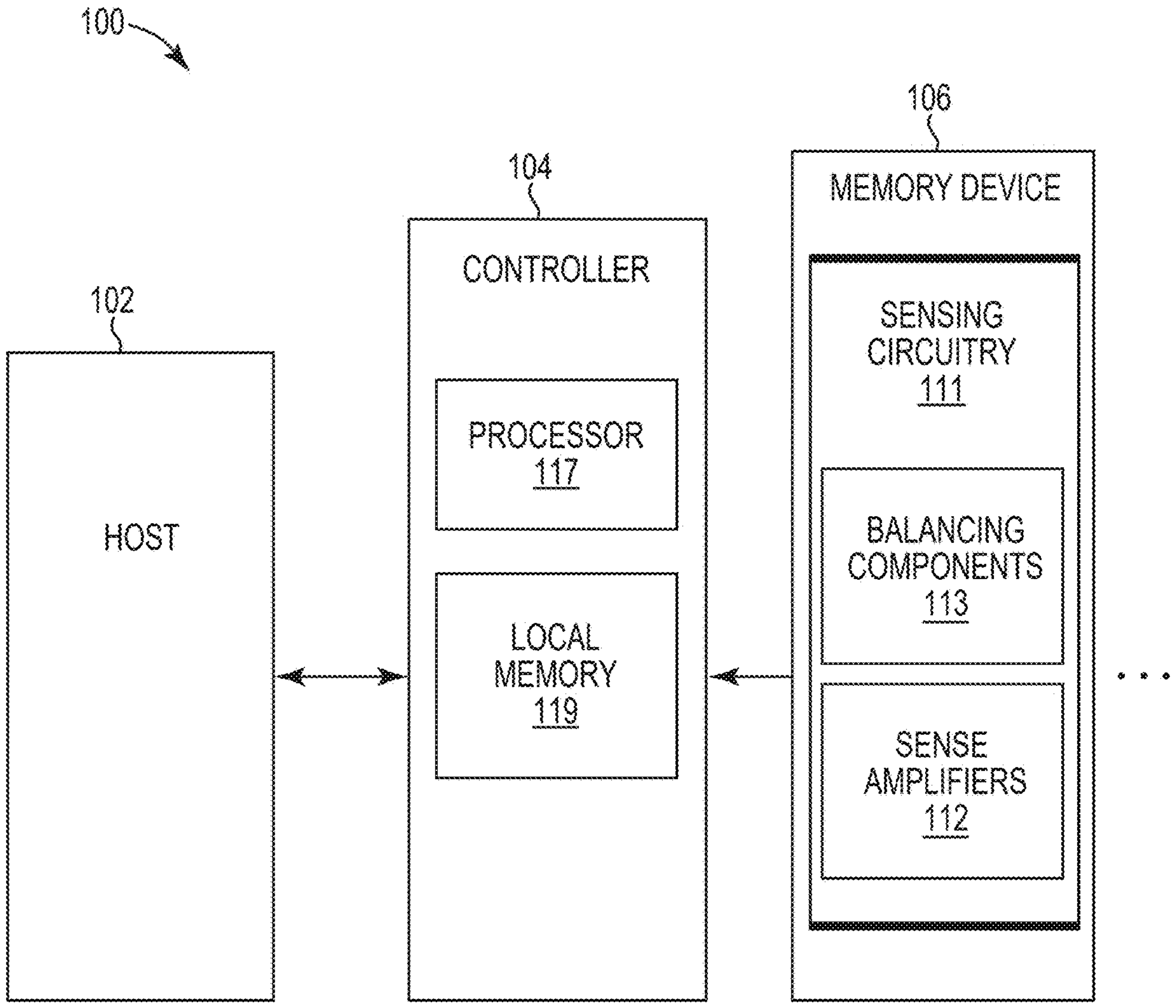
FIG. 1 illustrates an example electronic system that includes a host, a controller, and a device in accordance with various embodiments of the present disclosure.

The present disclosure includes apparatuses and methods related to a balancing component and/or a balancing controller utilized to balance a sense amp such that a reference digit line has an increased voltage to compensate for any imbalance between the reference digit line and the active digit line. In these embodiments, the balancing component can increase a voltage of the reference digit line relative to the active digit line. In this way, the sense amp can sense the memory cell with a smaller voltage difference on the digit lines.

As used herein, a sense amp can include a differential sense amp. As used herein, a differential sense amp is a device that is able to sense a voltage difference between two inputs (e.g., digit lines, etc.) and amplify the difference to be utilized by other electrical devices. In a specific example, the sense amp can be an NMOS-PMOS sense amplifier (N-P sense amp), although other differential sense amplifiers can be utilized in a similar way.

In some embodiments, the sense amp can utilize a compensation time to balance the sense amp. Balancing the sense amp can refer to a calibration step to ensure that the sensitivity to voltage on both of the input terminals (e.g., input digit lines, etc.) are equal. In some embodiments, the sense amp can utilize Vt compensation to compensate for Vt differences in the sense amp. In this way, the sense amp is able to identify a first voltage from a first input line the same way as a second voltage from a second input line. This can be important when the difference between the first voltage and the second voltage are relatively close or have a difference that is relatively small.

In some embodiments, the sense amp may be relatively balanced prior to activating a cell and/or word line associated with an active digit line connected to the sense amp. In some embodiments, activating the cell and/or word line can increase a voltage of the active digit line that imbalances the sense amp after the compensation. In this way, a voltage difference between the reference digit line and the active digit line can exist when the word line and/or cell are activated.

The present disclosure relates to a balancing component that compensates for the imbalance created by activating the word line and/or memory cell associated with the active digit line. For example, the balancing component can be a controller that can be utilized to send activation signals at different times during the compensation window to create a voltage difference between the first digit line and the second digit line to compensate for a voltage increase caused by activating the word line and/or memory cell associated with the active digit line. In another example, the balancing component can be a controller that can instruct isolation devices to provide different voltages to the first digit line and the second digit line to compensate for a voltage increase caused by activating the word line and/or memory cell associated with the active digit line.

In the following detailed description of the present disclosure, reference is made to the accompanying drawings that form a part hereof, and in which is shown by way of illustration how a number of embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, the designator "N" indicates that a number of the particular feature so designated can be included with a number of embodiments of the present disclosure.

As used herein, "a number of" something can refer to one or more of such things. For example, a number of memory devices can refer to one or more of memory devices. Additionally, designators such as "N", as used herein, particularly with respect to reference numerals in the drawings, indicates that a number of the particular feature so designated can be included with a number of embodiments of the present disclosure.

The figures herein follow a numbering convention in which the first digit or digits correspond to the drawing figure number and the remaining digits identify an element or component in the drawing. Similar elements or components between different figures may be identified by the use of similar digits. As will be appreciated, elements shown in the various embodiments herein can be added, exchanged, and/or eliminated so as to provide a number of additional embodiments of the present disclosure. In addition, the proportion and the relative scale of the elements provided in the figures are intended to illustrate various embodiments of the present disclosure and are not to be used in a limiting sense.

FIG. 1 illustrates an example electronic system 100 that includes a host 102, a controller 104, and a device 106 in accordance with various embodiments of the present disclosure.

The electronic system 100 can be, or can be part of, for example, a desktop computer, laptop computer, televisions, home theater system, gaming console, digital camera, network router and/or switch, printer, scanner, medical device, GPS navigation device, home device (e.g., thermostat, doorbell camera, security camera, smart lock, etc.), wearable device, industrial control system (e.g., automated industrial and/or control device) mobile computing device, a vehicle (e.g., airplane, drone, train, automobile, or other conveyance), Internet of Things (IoT) enabled device, embedded computer (e.g., one included in a vehicle, industrial equipment, or a networked commercial device), system-on-chip (SoC), chipset (e.g., a collection of integrated circuits), tile, Field-Programmable Gate Array (FPGA) structure (e.g., segmented FPGA structure), or other such device.

The electronic system 100 can be, or can include, a computing fabric. As used herein, the term "computing fabric" generally refers to a conveying, multiplexing, network, computing, or communication topology in which components pass data to each other through interconnecting switches, hubs, routers, multiplexers, buses, transmission lines and rings, cables, optical couplers and fibers, electromagnetic devices, or various other means. For example, a "computing fabric" can include various components (e.g., interconnects, crossbars, networks on chip, token rings, etc.) within a computing, memory, data storage and/or processing, network and/or telecommunication, artificial intelligence, control and/or telemetry, digital entertainment and/or other system, that facilitates in-chip and/or inter-chip communication.

The electronic system 100 includes a host 102. The host 102 can include a processor chipset and a software stack executed by the processor chipset. For example, the host 102 can be, or can include, a central processing unit (CPU) or a CPU complex that can be configured to execute an operating system.

The host 102 can be connected to the controller 104 via a physical and/or logical host interface that operates based on various communication protocols and to provide control, address, data, and other signals to the controller 104 (e.g., to further cause the controller 104 to control the device 106). Examples of the interface between the host 102 and the controller 104 can include, but not limited to, a bus interface (e.g., a serial advanced technology attachment (SATA) interface, a Serial Attached SCSI (SAS) interface, a Serial Attached SCSI (SAS) interface, a Small Computer System Interface (SCSI), a peripheral component interconnect express (PCIe) interface, ISA, etc.), a memory interface (e.g., a double data rate (DDR) interface, a dual in-line memory module (DIMM) interface, an Open NAND Flash Interface (ONFI) interface, an NVM Express (NVMe) interface), a Fibre Channel, an UART interface, an I2C interface, a Serial Peripheral Interface (SPI), an Universal Serial Bus (USB) interface, an ethernet interface, a general-purpose input/output (GIPO) interface, a custom interface, etc.

The controller 104 is communicatively connected to one or more electronic devices 106 such that signaling can be exchanged therebetween. Non-limiting examples of the devices 106 can include microcontrollers, microprocessors, digital logic circuits, analog circuits, light emitting diodes (LEDs), displays, sensors, motors, actuators, audio amplifiers, radio frequency (RF) circuits, test and measurement instruments (e.g., oscilloscopes, multimeters, etc.), automotive electronics, medical devices, telecommunication equipment, memory devices (e.g., volatile and/or non-volatile memory devices), graphics processing units, processors/coprocessors, logic blocks, intellectual property (IP) cores, etc. As used herein, a "core" or "IP core" generally refers to one or more blocks of data and/or logic that form constituent components of an application-specific integrated circuit or field-programmable gate array. The circuit portion areas can be designed, built, and/or otherwise configured to perform specific tasks and/or functions within the systems described herein.

As shown in FIG. 1, the controller 104 can include a processing device (e.g., processor 117) that can execute instructions stored in a local memory 119 to perform various operations described herein. The controller 104 can include various special purpose circuitry in the form of an ASIC, FPGA, state machine, and/or other logic circuitry that can perform operations described herein. As an example, the controller 104 can be a memory controller.

In various embodiments, one or more constituent components (e.g., host 102, controller 104, device 106, etc.) of system 100 can be part of a SoC. In one example, a device 106 itself can correspond to an SoC, while the host 102 and the controller 104 are considered "external" to the SoC. In another example, the host 102 or the controller 104, or both, can be considered as a part of an SoC along with the device 106 being internal or external to the SoC.

As shown in FIG. 1, the controller 104 can include balancing component 113 (e.g., balancing controller, etc.). The balancing component 113 can be resident on the controller 104. In other embodiments, the balancing component 113 or a portion of the balancing component 113 by not be resident on the controller 104. As used herein, the term "resident on" refers to something that is physically located on a particular component. For example, the balancing component 113 being "resident on" the controller 104, for example, refers to a condition in which the hardware circuitry that comprises the balancing component 113 is physically located on the controller 104. The term "resident on" may be used interchangeably with other terms such as "deployed on" or "located on," herein. In some embodiments, the balancing component 113 is part of the host 102, an application, or an operating system. Although not shown in FIG. 1 so as to not obfuscate the drawings, the balancing component 113 can include various circuitry to facilitate aspects of the disclosure described herein. For example, the balancing component 113 can include various circuitry to increase a voltage of a reference digit line of a sense amp to compensate for a memory cell or word line associated with an active digit line of the sense amp.

Although the balancing component 113 and sense amplifiers 112 are illustrated as separate components, embodiments of the present disclosure are not so limited. For example, the balancing component 133 can include activations devices that are components of the sense amplifiers 112. In some embodiments, the balancing component 133 can be an isolation device and/or controller to provide activation signals to the isolation device. In this way, the balancing component 113 can provide a balancing effect for the sense amplifier 112 by increasing a voltage on the first digit line as compared to the second digit line.

Figure 2:
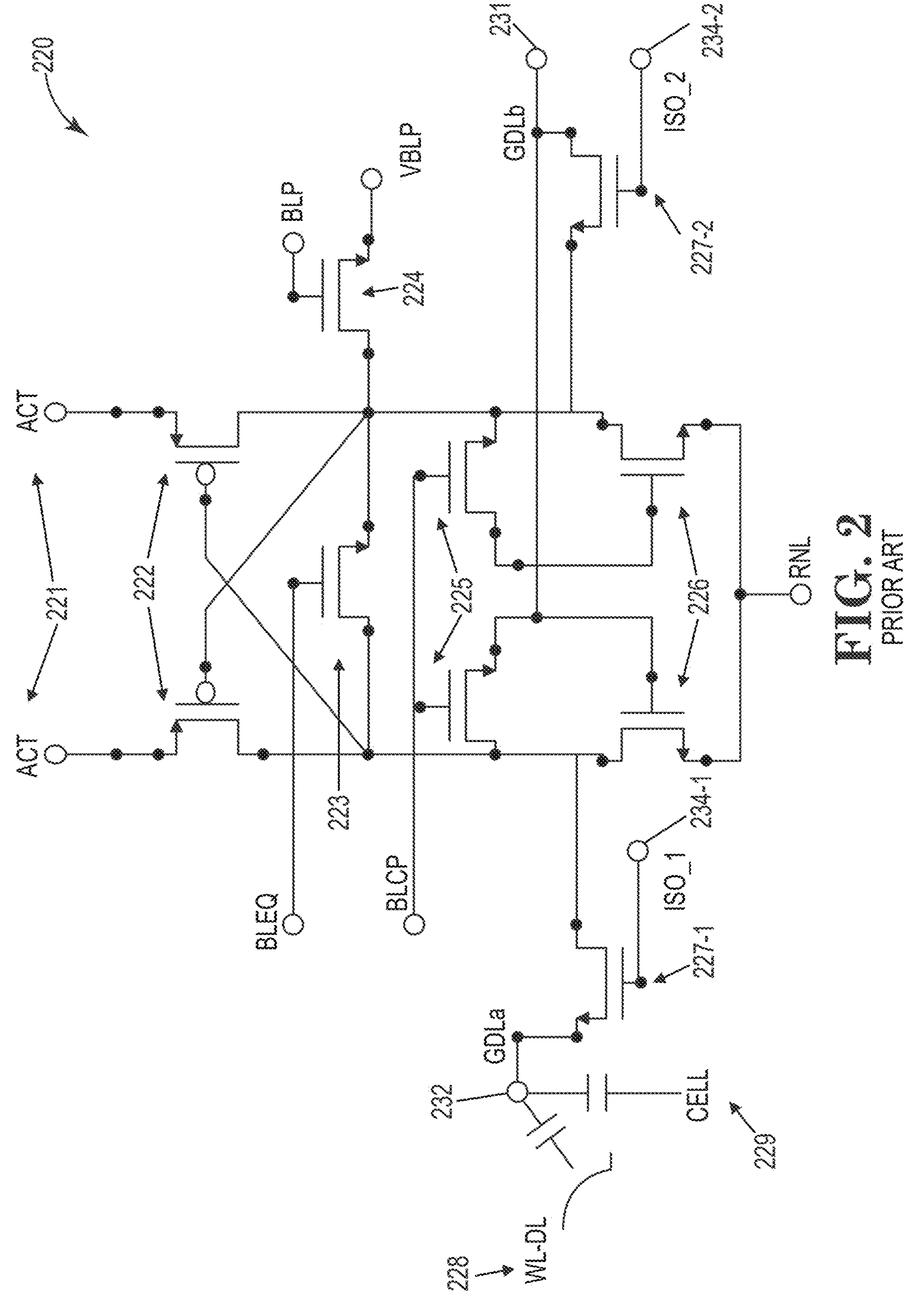
FIG. 2 PRIOR ART
FIG. 2 illustrates an example sense amp that includes a first digit line and a second digit line in accordance with some embodiments of the present disclosure.

FIG. 2 illustrates an example sense amp 220 connected to a first digit line 231 and a second digit line 232 in accordance with some embodiments of the present disclosure. FIG. 2 illustrates a conventional differential sense amplifier circuit and a pair of complementary digit lines 231 (GDLb) and 232 (GDLa), which may also be referred to as bit lines. As known in the art, when memory cells are accessed, a row of memory cells are activated and sense amplifiers are used to amplify a data state for the respective column of activated memory cells by coupling each of the digit lines of the selected column to voltage supplies such that the digit lines have complementary logic levels.

In this example, the sense amp 220 includes a bit line equalization (BLEQ) transistor 223. The BLEQ transistor 223 can be utilized to equalize or balance the voltages on the digits lines before a read operation commences. The sense amp 220 includes bit line compensation (BLCP) transistors 225. The BLCP transistors 225 can be utilized for setting the bit lines (e.g., 231/232) to a known voltage difference for sense amp imbalance before a read or write operation begins. In some embodiments, the sense amp 220 includes a bit line pre-charge (BLP) transistor 224 to establish the correct voltage conditions on the bit lines before and during memory operations.

When a memory cell 229 is accessed, the voltage of one of the digit lines increases or decreases slightly, depending on whether the memory cell 229 coupled to the active digit line (e.g., 232 in this example) is charged or not, resulting in a voltage difference between the digit lines 231/232. As an example, the memory cell 229 can be a DRAM cell comprising a capacitor and an access transistor whose gate is connected to a word line. The voltage of the digit line connected to the cell being read increases or decreases slightly (e.g., active digit line), the other digit line serves as a reference. Respective transistors are enabled after the voltage difference is established, thereby driving the slightly higher voltage digit line to a supply voltage and the other digit line to a reference voltage, such as ground, to further drive each of the digit lines in opposite directions and amplify the selected digit line signal depending on the data value stored in the memory cell.

The digit lines are precharged to a precharge voltage, such as one-half of a supply voltage (e.g., Vcc/2, which may be 0.5V) when no word line is active, so that a voltage difference can be accurately sensed and amplified on sense nodes during a subsequent sensing operation. However, when a low data state signal from a memory cell 229 is weakly signaled, while P-channel transistors (e.g., transistors 222) of a sense amplifier has a weakness to voltage threshold (Vt) offset, the digit lines may not be amplified to reflect a logic high or low level in a timely fashion, and sensed and amplified levels on sense nodes may not be reflected on local input/output (LIO) nodes while the LIO nodes are coupled to the sense nodes. Such delay in amplification can cause the sense amplifier to erroneously to provide signals in the wrong direction. There is, therefore, a need for a sense amplifier design that timely amplifies the digit lines even for the weak low data state signal from the memory cell 229.

The sense amp 220 consists of a cross-coupled NMOS transistor pair (e.g., transistors 226) forming an N-sense amplifier, and a cross-coupled PMOS transistor pair (e.g., transistors 222) forming a P-sense amplifier. The N-sense-amp source is labeled RNL. Similarly, the P-sense-amp source is labeled ACT (for ACTive pull-up).

Since the digit line pair are both initially at Vcc/2 volts, the N-sense-amp transistors are initially off due to zero Vgs potential. Similarly, both P-sense-amp transistors are initially off due to their positive Vgs potential. In these embodiments, a signal voltage develops between the digit line pair when the memory bit access occurs. While one digit line (e.g., digit line 232) contains charge from the cell 229 access, the other digit line (e.g., digit line 231) serves as a reference for the sensing operation. The sense amplifier firing generally occurs sequentially rather than concurrently (e.g., the N-sense-amp fires first and the P-sense-amp fires second).

After the N-sense-amp fires, the activation signal ACT 221 will be driven toward Vcc volts. This activates the P-sense-amp that operates in a complementary fashion to the N-sense-amp. With the low voltage digit line approaching ground, a strong signal will exist to drive the appropriate PMOS transistor into conduction. This will charge the high voltage digit line toward ACT 221, ultimately reaching Vcc.

The sense amp 220 can be coupled to transistors 227-1, 227-2 serving as isolation devices that can be utilized to selectively enable or disable the connection between the sense amp 220 and the memory cell 229 or the data bus. The gates of the isolation devices 227-1, 227-2 are coupled to a corresponding ISO signal 234-1, 234-2, which is selectively enabled to ensure that the sense amp 220 is engaged at the appropriate times such as, but not limited to: Vt compensation, activation, and/or precharge.

As described further herein, activating the word line coupled to the gate of the access transistor of the memory cell 229 results in capacitive coupling 228 (e.g., WL-DL) between the word line and the active digit line, which can result in an increase to a voltage of the active digit line 232. In this way, the digit line 232 may be out of balance from the digit line 231. The present disclosure utilizes the balancing components 113 as referenced in FIG. 1, which can alter an activation timing and/or isolation device timing described further herein, to increase a voltage of the digit line 231 to compensate for the increase in voltage on the digit line 232 due to WL-DL capacitive coupling 228 and/or due to cell capacitance.

Figure 3:
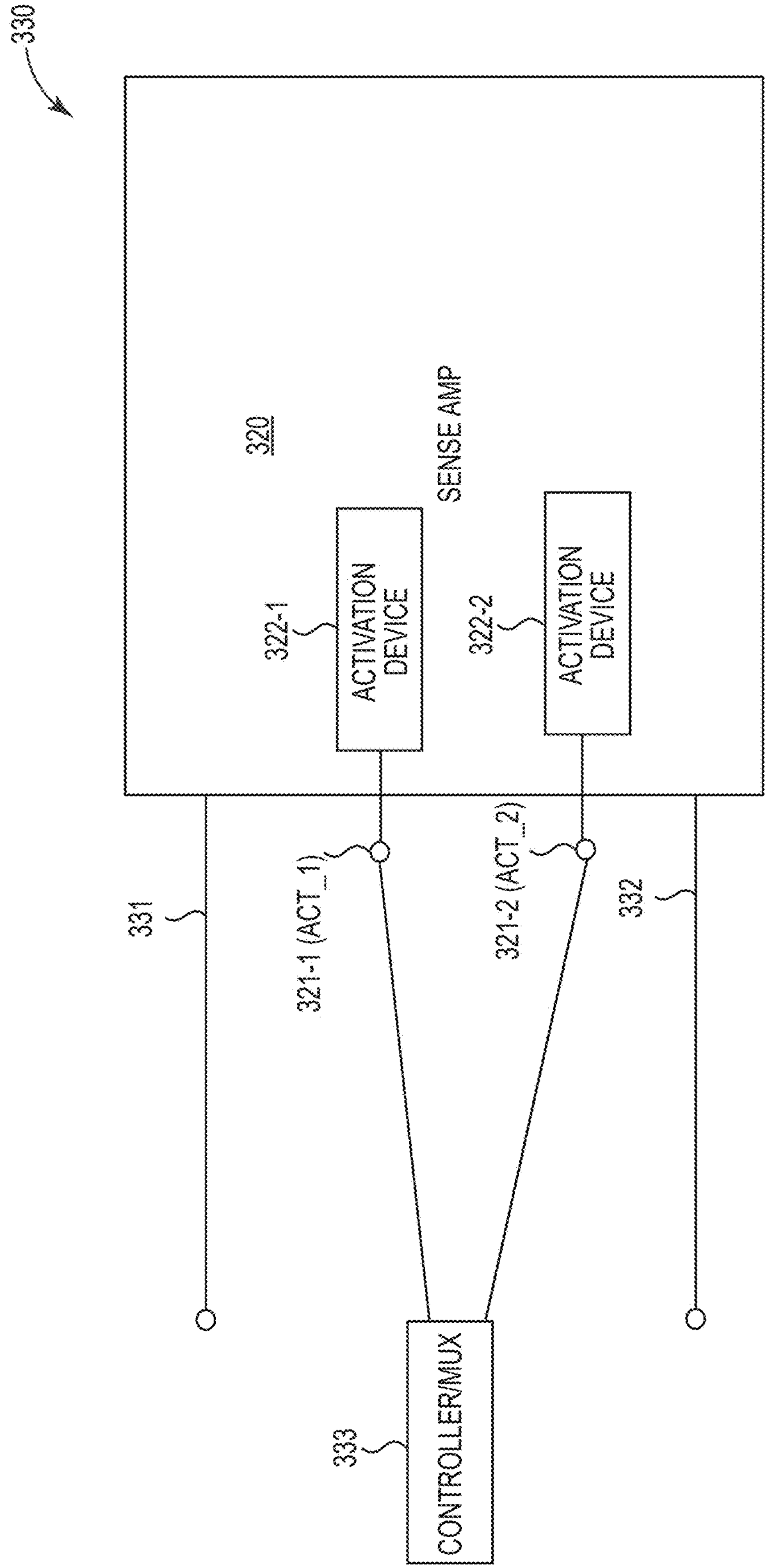
FIG. 3 illustrates an example of a system that includes a sense amp that utilizes a controller to alter a balance between the first digit line and the second digit line in accordance with some embodiments of the present disclosure.

FIG. 3 illustrates an example of sensing circuitry 311 that includes a sense amp 320 that utilizes a controller 333 to alter a balance between the first digit line 331 and the second digit line 332 in accordance with some embodiments of the present disclosure. In some embodiments, the sense amp 320 is a differential sense amp. For example, the sense amp 320 can be an N-P sense amp (e.g., sense amp 220 as referenced in FIG. 2, etc.) that includes a cross coupled NMOS transistor and PMOS transistor to determine a value of a cell.

In some embodiments, the system 330 includes a sense amp 320 connected to a first digit line 331 and a second digit line 332. In addition, the system 330 can include a first activation device 322-1 associated with the first digit line 331 and a second activation device 322-2 associated with the second digit line 332. As described herein, the first digit line 331 is a reference digit line and the second digit line 332 is an active digit line. As used herein, the reference digit line can be set to a reference voltage and the active digit line can be connected to a memory cell being read to determine the value of the memory cell (e.g., logic 1 or 0). In this way, the sense amp 320 can determine the value of the memory cell by comparing the voltage difference between the first digit line 331 and the second digit line 332.

In some embodiments, the controller 333 can be configured to send a first activation signal 321-1 to the first activation device 322-1 at a first time during a compensation window and send a second activation signal 321-2 to the second activation device 322-2 at a second time during the compensation window. In these embodiments, the first time and the second time have a time difference that corresponds to a threshold voltage difference between the first digit line 331 and the second digit line 332.

In some embodiments, the first activation signal 321-1 can be sent by the controller 333 prior to the second activation signal 321-2 during compensation time. In this way, a charge from an activated transistor can be discharged on to the first digit line 331 for a longer period of time compared to an activated transistor discharged on to the second digit line 332. In some embodiments, providing the first activation signal 321-1 to the first activation device 322-1 and/or the first digit line 331 prior to providing the second activation signal 321-2 to the second activation device 322-2 and/or the second digit line 332 can result in having a relatively higher voltage on the first digit line 331 compared to a voltage on the second digit line 332 during the compensation window of the sense amp 320. In this way, the first digit line 331 can have a relatively higher voltage than the second digit line 332 after the compensation window. This can be different than previous sense amp devices that attempt to ensure that the voltage of the first digit line 331 is as close to the voltage of the second digit line 332 as possible to balance the sense amp 320.

The voltage difference between the first digit line 331 and the second digit line 332 can be referred to as a threshold voltage difference to compensate for a memory cell and/or a word line connected to the second digit line 332, which can increase a voltage of the second digit line 332 when activated. In this way, the threshold voltage difference between the first digit line 331 and the second digit line 332 compensates for a memory cell and a word line connected to the second digit line 332. That is, the controller 333 can provide a balancing effect for the sense amp 320 by increasing a voltage on the first digit line 331 as compared to the second digit line 332.

In some embodiments, the threshold voltage difference can be the same or similar quantity of voltage increase on the second digit line 332 caused by activating the word line and/or memory cell connected to the second digit line 332. In this way, although the first digit line 331 is intentionally not in balance with the second digit line 332, the word line and/or memory cell can be activated to increase the voltage of the second digit line 332 to bring the first digit line 331 and the second digit line 332 back in balance after the compensation window ends.

In some embodiments, the threshold voltage difference is a difference between a first voltage of the first digit line 331 and a second voltage of the second digit line 332. In these embodiments, the first voltage is greater than the second voltage to compensate for a memory cell and a word line connected to the second digit line 332. As described herein, the first voltage is greater than the second voltage when the first digit line 331 is a reference digit line and the second digit line 332 is an active digit line.

As described herein, the second digit line 332 can remain deactivated during the time difference between the first activation signal 321-1 and the second activation signal 321-2 during compensation time. As described herein, the first activation signal 321-1 can be provided to the first activation device 322-1 prior to the second activation signal 321-2 being provided to the second activation device 322-2 to allow the first digit line 331 to have a relatively higher voltage compared to the second digit line 332. For this reason, the second digit line 332 can remain deactivated or can remain without receiving an activation signal to allow the first digit line 331 to charge for a longer period of time compared to the second digit line 332.

In some embodiments, the system 330 includes a first isolation device that is connected to the first digit line 331 and a second isolation that is connected to the second digit line 332. In these embodiments, the first isolation device and second isolation device are deactivated during the compensation window and are activated upon completion of the compensation window. In these embodiments, the first isolation device is configured to capacitively couple a first voltage to the first digit line 331 when activated and the second isolation device is configured to capacitively couple a second voltage 332 to the second digit line when activated.

As described further herein, the first isolation device can be connected to a first gate of a first transistor. In these embodiments, the drain of the first transistor can be connected to the first digit line 331. In this way, the first isolation device can capacitively couple a first voltage to the first gate of the first transistor and the first transistor can provide a corresponding voltage to the first digit line 331. In these embodiments, the second isolation device can be connected to a second gate of a second transistor. In these embodiments, the drain of the second transistor can be connected to the second digit line 332. In these embodiments, the second isolation device can capacitively couple a second voltage to the second gate of the second transistor and the second transistor can provide a corresponding voltage to the second digit line 332.

In some embodiments, the first voltage provided to the first gate of the first transistor can result in a corresponding voltage to the first digit line 331 compared to the corresponding voltage provided to the second digit line 332 in response to the second voltage provided to the second gate of the second transistor. In this way, the first transistor can provide a greater voltage to the first digit line 331 than the voltage provided to the second digit line 332 by the second transistor. In this way, the first digit line 331 can have a relatively greater voltage than the second digit line 332 prior to activating the memory cell and/or word line connected to the second digit line 332. In this way, the relatively greater voltage provided to the first digit line 331 can be utilized to compensate for the increased voltage provided to the second digit line 332 in response to activating the memory cell and/or word line connected to the second digit line 332.

As described herein, the compensation window can be executed to ensure that a voltage sensed at the first digit line 331 and at the second digit line 332 are equal or close to equal. However, when the word line and/or memory cell connected to the second digit line 332 are activated, the voltage of the second digit line 332 is increased which results in an imbalance between the first digit line 331 and the second digit line 332. In some embodiments, the controller 333 can be utilized to compensate for the increased voltage on the second digit line 332 due to activating the word line and/or memory cell connected to the second digit line 332. In this way, the first digit line 331 can be increased by a similar voltage as the second digit line 332 is increased as a result of activating the word line and/or memory cell.

In some embodiments, the controller 333 increases the voltage of the first digit line 331 to increase a voltage margin of the first digit line 331. In a similar way, the controller 333 increases the voltage of the first digit line 331 results in a decrease of a voltage margin of the second digit line 332. As used herein, the voltage margin of a digit line refers to a difference between an actual detected voltage level that represents a "1" or a "0" and a minimum voltage level required to reliably distinguish between the two states. By increasing the voltage margin of the first digit line 331 or reference digit line can improve the ability of the sense amp 320 to detect when the state of the memory cell is a "0". In contrast, by decreasing the voltage margin of the second digit line 332 or active digit line can decrease the ability of the sense amp 320 to detect when the state of the memory cell is a "1".

Even though the decreasing the voltage margin of the second digit line 332 can decrease the ability of the sense amp 320 to detect when the state of the memory cell is a "1", the overall deadband of the sense amp 320 can be increased with the increase to the ability of the sense amp 320 to detect when the state of the memory cell is a "0". As used herein, the deadband of the sense amp 320 refers to a voltage range within which the sense amplifier does not distinctly differentiate between a logical "0" and a "1".

In some embodiments, a value or voltage of a memory cell can "leak" over a period of time. As used herein, memory cell "leakage" refers to an unintentional loss of electrical charge from a memory cell in a semiconductor device, such as those found in Static Random-Access Memory (SRAM), Dynamic Random-Access Memory (DRAM), or flash memory. In this way, a particular memory cell that is storing a logical "0" may "leak" towards the logical state of "1" and a memory cell that is storing a logical "1" may "leak" towards the logical state of "0".

In some embodiments, the memory cell "leaks" from the logical state of "O" towards the logical state of "1" relatively faster than the memory cell "leaks" from the logical state of "1" to the logical state of "0". For this reason, increasing the voltage margin for detecting the "0" can increase the overall deadband for a memory cell since a stored value of "0" will still "leak" to the deadband before a stored value of "1" will "leak" to the deadband. In this way, the ability of the sense amp 320 to detect either state will increase since even though the ability to detect the "0" is helped and the ability to detect the "1" is hurt. That is, the quantity of time it takes for a memory cell voltage to "leak" to the deadband of the sense amp 320 will increase.

Figure 4:
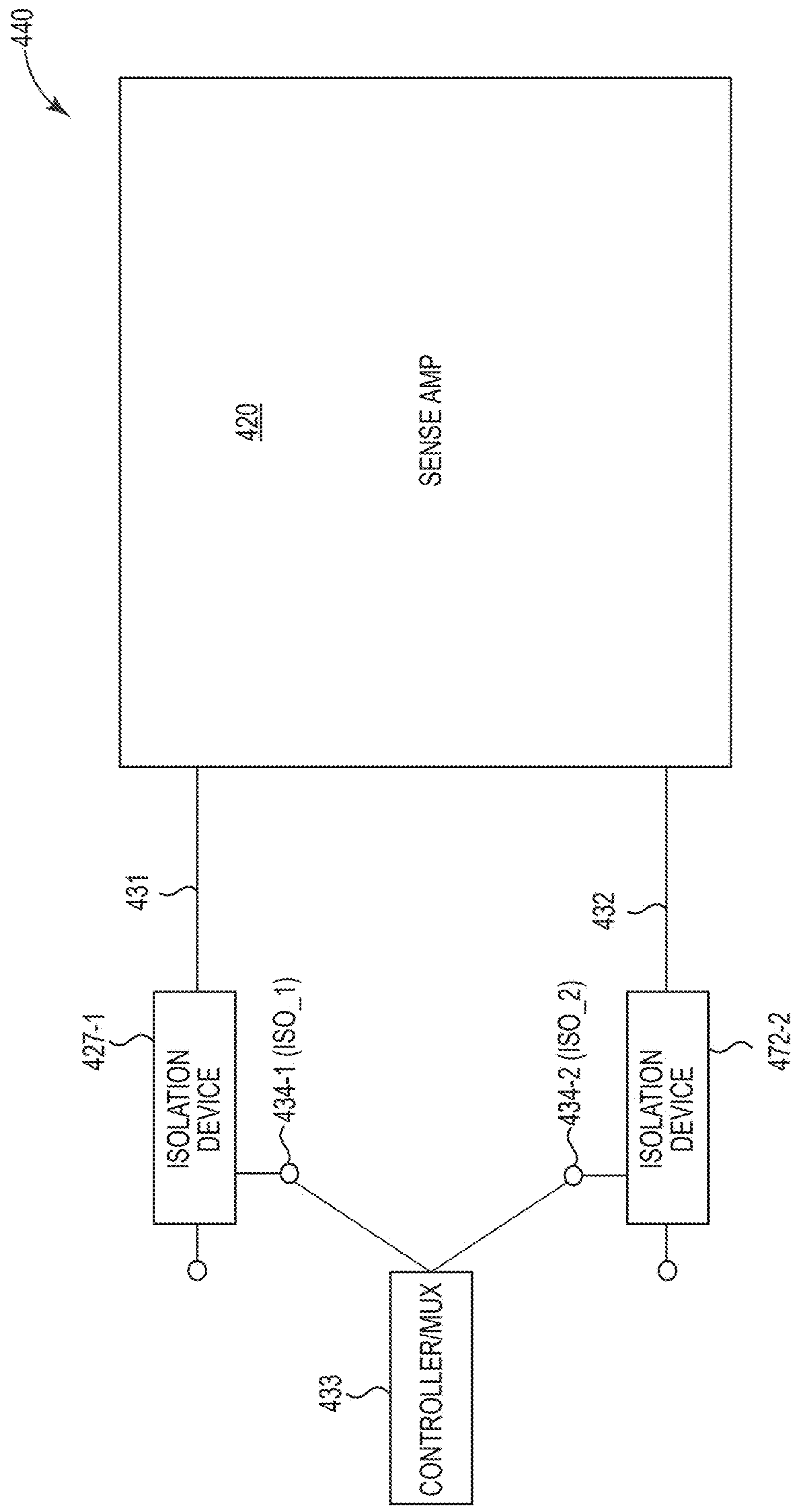
FIG. 4 illustrates an example of a system that includes a sense amp that utilizes a plurality of isolation devices in accordance with some embodiments of the present disclosure.

FIG. 4 illustrates an example of sensing circuitry 411 that includes a sense amp 420 that utilizes a plurality of isolation devices (e.g., first isolation device 427-1, second isolation device 427-2, etc.) in accordance with some embodiments of the present disclosure. In some embodiments, the first isolation device 427-1 and/or the second isolation device 427-2 can be activated utilizing an activation signal (e.g., ISO signal, first activation signal 434-1, second activation signal 434-2, etc.) to provide a charge or voltage to a gate of a corresponding transistor in response to completion of the compensation window.

In some embodiments, the system 440 includes a sense amp 420 connected to a first digit line 431 and a second digit line 432. In these embodiments, the system 440 includes a first isolation device 427-1 connected to the first digit line 431 and a second isolation device 427-2 connected to the second digit line 432. In some embodiments, the first digit line 431 is a reference digit line. However, in some embodiments, a reference digit line and an active digit line of the sense amp 420 can switch. That is, the reference digit line can switch from the first digit line 431 to the second digit line 432 and the active digit line can switch from the second digit line 432 to the first digit line 431.

In some embodiments, the system 440 includes a first isolation device 427-1 connected to the first digit line 431 to capacitively couple a first voltage to the first digit line 431 in response to a first activation signal 434-1. In some embodiments, the system 440 includes a second isolation device 427-2 connected to the second digit line 432 to capacitively couple a second voltage to the second digit line 432 in response to a second activation signal 434-2. In these embodiments, the first voltage is greater than the second voltage by a threshold voltage difference.

As described herein, the first isolation device 427-1 can be a device that is able to provide a first voltage to a gate of a first transistor (e.g., transistor 227-1 as referenced in FIG. 2, etc.). In these embodiments, the first transistor can include a drain that is connected to the first digit line 431. When the first isolation device 427-1 provides the first voltage to the gate of the first transistor, the first transistor can capacitively couple a corresponding voltage to the first digit line 431. As described herein, the voltage coupled by the first transistor can correspond to the value of the first voltage. That is, when the first voltage is relatively greater, the corresponding voltage coupled by the first transistor can be relatively greater.

As described herein, the first voltage provided by the first isolation device 427-1 can be relatively greater than the second voltage provided by the second isolation device 427-2. In this way, the coupled voltage from the first transistor can be greater than the coupled voltage of the second transistor. Thus, the voltage on the first digit line 431 can be relatively greater than the voltage on the second digit line 432 after activating the first isolation device 427-1 and the second isolation device 427-2 after Vt compensation, but before sensing. Although illustrated as separated devices, the first isolation device 427-1 and the second isolation device 427-2 can be a single device that is capable of providing different voltages to the first transistor and the second transistor. In some embodiments, the controller 433 can be utilized to identify which of the first digit line 431 and the second digit line 432 are the corresponding reference digit line and active digit line. In response, the controller 433 can be utilized to instruct the first isolation device 427-1 and/or second isolation device 427-2 on what voltage they are to provide the gates of the corresponding transistors.

In some embodiments, the threshold voltage difference is to compensate for a word line and a memory cell connected to the second digit line. As described herein, the voltage difference between the first digit line 431 and the second digit line 432 can correspond to a voltage increase provided to the active digit line in response to activating the word line and/or memory cell connected to the active digit line. In some embodiments, the voltage difference provided to the gate of the first transistor and the gate of the second transistor may not correspond to the same voltage difference capacitively coupled from the drain of the first transistor to the first digit line 431 and/or from the drain of the second transistor to the second digit line 432. For this reason, the voltage difference between the voltage capacitively coupled by the first isolation device 427-1 and the second isolation device 427-2 can be based on a resulting voltage difference between a voltage difference capacitively coupled from the drain of the first transistor to the first digit line 431 and/or from the drain of the second transistor to the second digit line 432.

In some embodiments, the first isolation device 427-1 is connected to a first gate of a first transistor and the second isolation device 427-2 is connected to a second gate of a second transistor. In some embodiments, a first drain of the first transistor is connected to the first digit line 431 and a second drain of the second transistor is connected to the second digit line 432.

In some embodiments, the system 440 includes a controller 452 configured to identify the first digit line 431 as a reference digit line and the second digit line 432 as an active digit line. As described herein, the first digit line 431 can be the reference digit line and the second digit line 432 can be the active digit line. However, the active digit line and the reference digit line can be switched in some embodiments. For this reason, the controller 452 cand identify the reference digit line and provide a signal to the corresponding balancing capacitor.

In some embodiments, the system 440 includes a controller 433 configured to send a first activation signal to the first digit line at a first time during a compensation window when the first isolation device 427-1 and the second isolation device 427-2 are deactivated. As described herein, the controller 433 can send activation signals at different times to allow the first digit line 431 to charge for a first period of time or a first quantity of time and allow the second digit line 432 to charge for a second period of time or a second quantity of time. This can be performed during the compensation window while the first isolation device 427-1 and the second isolation device 427-2 are deactivated. In some embodiments, the first digit line 431 can have larger voltage than the second digit line 432 when the first isolation device 427-1 and/or the second isolation device 427-2 are activated by the controller 433.

In these embodiments, the controller 433 can be configured to send a second activation signal to the second digit line 432 at a second time during the compensation window. In these embodiments, the first time and the second time have a time difference that corresponds to a voltage threshold difference between the first digit line 431 and the second digit line 432.

Figure 5:
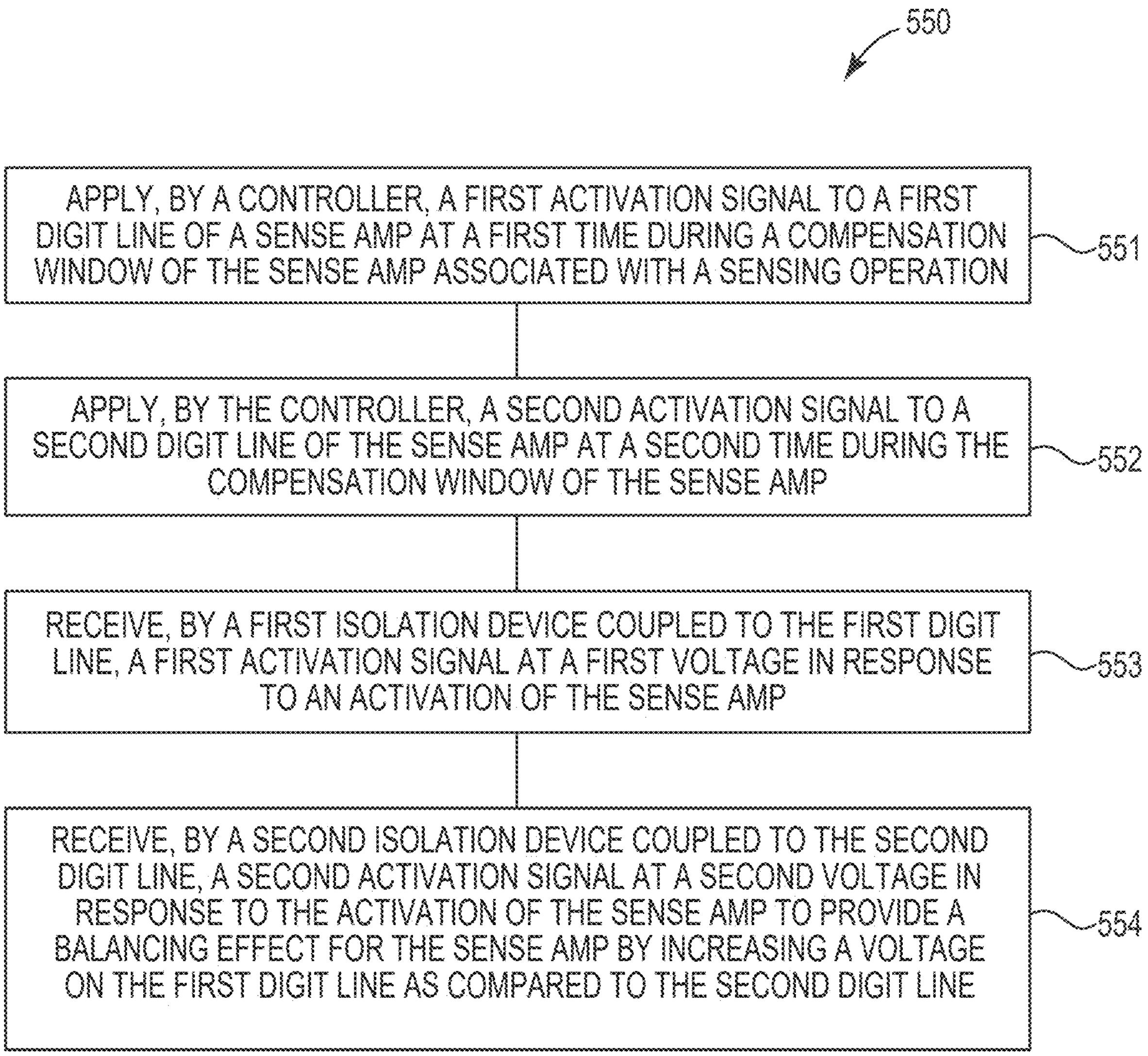
FIG. 5 is a flow diagram corresponding to a method for balancing a sense amp in accordance with some embodiments of the present disclosure.

FIG. 5 is a flow diagram corresponding to a method 550 for balancing a sense amp in accordance with some embodiments of the present disclosure. The method 550 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 550 is performed by the balancing component 113 (e.g., controller, balancing controller, etc.) of FIG. 1. In some embodiments, the method 550 can be executed utilizing a system or apparatus such as system 330 as referenced in FIG. 3, and/or system 440 as referenced in FIG. 4.

Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

The method 550 can be executed at step 551 to provide, by a controller, a first activation signal to a first digit line of a sense amp at a first time during a compensation window of the sense amp. As described herein, the activation signal can be provided or capacitively coupled by circuits or mechanisms for compensation. The activation signal can trigger circuits of the sense amp to adjust the settings or characteristics before an operation begins. For example, it might activate a circuit that adjusts the threshold voltage of the sense amp to compensate for temperature variations or other variations.

The method 550 can be executed at step 552 to provide, by the controller, a second activation signal to a second digit line of the sense amp at a second time during the compensation window of the sense amp. In these embodiments, the first time and the second time have a time difference that corresponds to a first threshold voltage difference between the first digit line and the second digit line. As described herein, the first activation signal can enable the first digit line to begin charging or increasing a voltage of the first digit line. In these embodiments, the second activation signal can be provided to the second digit line at a later time or after a particular quantity of time to enable the second digit line to being charging or increasing a voltage of the second digit line after the first digit line has been charging for the particular quantity of time. In this way, the first digit line can charge for a relatively longer period of time compared to the second digit line and the first digit line can have a relatively greater voltage compared to the second digit line at the end of the compensation window.

The method 550 can be executed at step 553 to provide, by a first isolation device connected to the first digit line, a first voltage to the first digit line in response to an activation of the sense amp. As described herein, the first isolation device can provide a first voltage to a first gate of a first transistor that has a first drain connected to the first digit line. In this way, a first voltage is provided to the first digit line through a discharge at the first drain of the first transistor when the first isolation device provides the first voltage at the first gate.

The method 550 can be executed at step 554 to provide, by a second isolation device connected to the second digit line, a second voltage to the second digit line in response to the activation of the sense amp, wherein the first voltage is greater than the second voltage by a second threshold voltage difference. As described herein, the second isolation device can provide a second voltage to a second gate of a second transistor with a second gate connected to the second digit line. In this way, the second transistor can provide a different discharge voltage to the second digit line through the second drain.

In some embodiments, the method 550 can include determining that the first digit line is a reference digit line and the second digit line is an active digit line of the sense amp. As described herein, the active digit line and the reference digit line for a sense amp can switch. For this reason, the active digit line and the reference digit line can be identified before providing a greater voltage to the reference digit line to compensate for activating the memory cell and/or word line connected to the active digit line.

In some embodiments, the time difference between the first activation signal and the second activation signal provides a greater voltage to the first digit line than the second digit line. As described herein, the time difference can correspond to a voltage difference between the reference digit line and the active digit line. For example, a relatively longer time difference can result in a relatively greater voltage difference between the reference digit line and the active digit line.

In some embodiments, the first voltage provided by the first isolation device provides a greater voltage to the first digit line than the second voltage provided by the second isolation device to the second digit line. As described herein, the voltage provided to a gate of a transistor can affect the voltage discharged at the drain of the transistor. In this way, the first voltage provided to the first gate of the first transistor can be greater than a second voltage provided to the second gate of the second transistor to provide a greater discharge voltage at the first drain than the discharge voltage at the second drain. In some embodiments, the increased discharge voltage or difference in the discharge voltage can be based on the discharge voltage associated with activating the word line and/or memory cell connected to the active digit line. In this way, the voltage difference can compensate for the voltage applied to the active digit line in response to activating the word line and/or memory cell connected to the active digit line.

Figure 6:
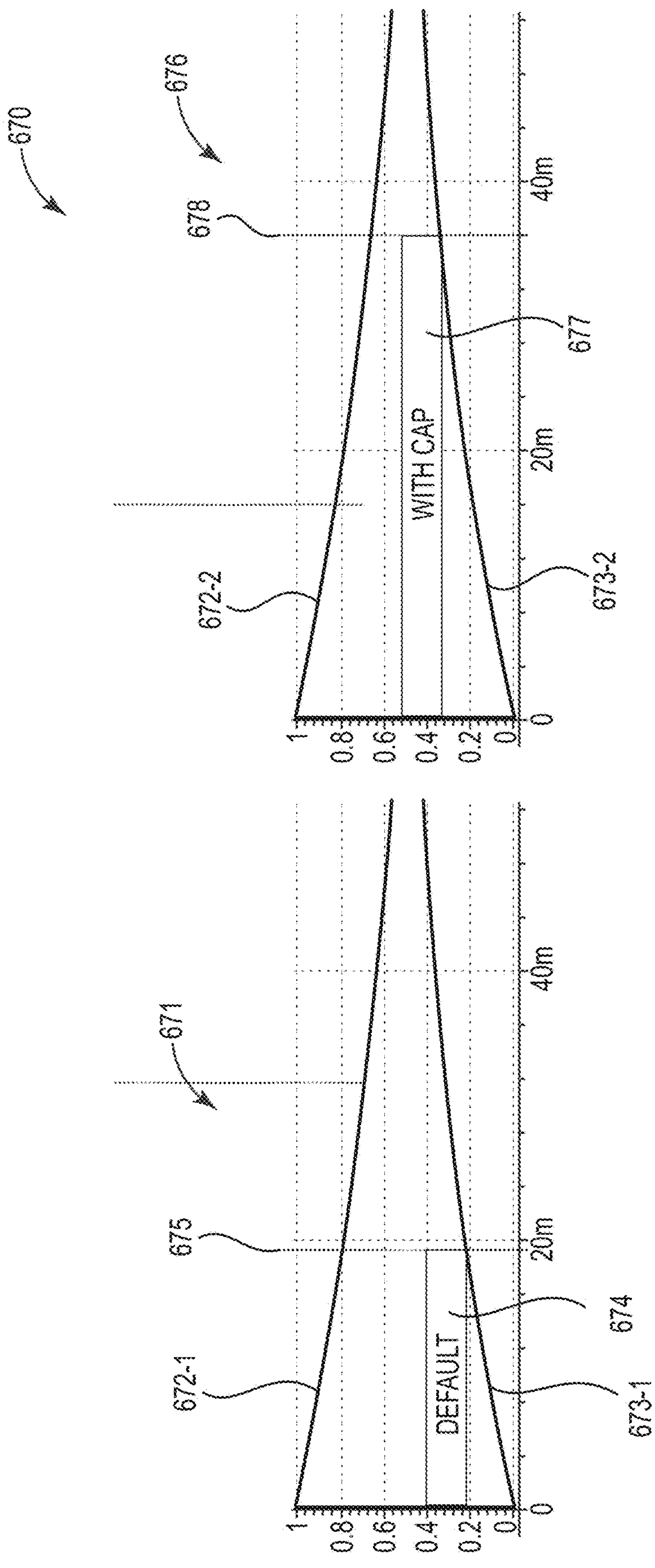
FIG. 6 is a graph diagram illustrating a deadband caused by different charge leakage of memory cells associated with some embodiments of the present disclosure.

FIG. 6 is a graph diagram 670 illustrating a deadband caused by different charge leakage of memory cells associated with some embodiments of the present disclosure. The graph diagram 670 illustrates a default leakage graph 671 and a balancing component leakage graph 676. The default leakage graph 671 illustrates a default deadband 674 and the balancing component leakage graph illustrates a balancing component deadband 677.

As described herein, the deadband can refer to a point (e.g., voltage window) at which a sense amp is unable to accurately sense the cell. That is, the sense amp is unable to accurately determine if the stored value of the cell is a "1" or a "0". In graph 671, line 672-1 represents voltage leakage from a high voltage (e.g., a Vcc voltage of 1V) representing a stored logic value of "1," and line 673-1 represents a voltage leakage from a low voltage (e.g., 0V) representing a stored logic "0." As used herein, line 672-1 can be referred to as the "high leakage," and line 673-1 can be referred to as the "low leakage."

The default deadband 674 can include a voltage range where the sense amp is not able to accurately sense the stored value. In this way, the memory cell is not able to be read when either the high leakage 672-1 or the low leakage 673-1 enters the range of voltages represented by the default deadband 674. In a specific example, the deadband voltage range can be between 0.2 V and 0.4 V. In this embodiment, the default deadband 674 is crossed by the low leakage 673-1 at the time 675 (e.g., 20 milliseconds, etc.). In these embodiments, the default deadband 674 can be crossed by the low shift 673-1 prior to being crossed by the high shift 672-1. However, the cell is not accurately sensed by the sense amp when either the low shift 673-1 or the high shift 672-1 cross the default deadband 674.

As described herein, shifting the deadband toward the equilibration voltage (e.g., 0.5 V as illustrated by the default leakage graph 671 and the balancing component leakage graph 676) can provide benefits such as extending the refresh passing limit of the sense amplifier, which refers to the amount of time a cell can be accurately sensed in the absence of a refresh operation. As described herein, the voltage of the reference digit line can be increased by activating isolation devices at different times and/or activating activation devices at different times. In this way, the balancing component deadband 677 of the balancing component leakage graph 676 is shifted toward the equilibration voltage. For example, the range of voltages for the balancing component deadband 677 is between 0.4 V and 0.6 V.

In these embodiments, the balancing component deadband 677 extends to the time 678, which is greater than the time 675 as illustrated in the default leakage graph 671. In these embodiments, the leakage of the cell is the same between the default leakage graph 671 and the balancing component leakage graph 676. For example, the high shift 672-1 and the low shift 673-1 can be the same as the high shift 672-2 and the low shift 673-1. However, it can take longer for the low shift 673-2 to enter the balancing component deadband 677 than it took for the low shift 673-1 to enter the default deadband 674.

In this way, the high shift 672-2 is going to reach the balancing component deadband 677 faster than the high shift 672-1 will reach the default deadband 674, but since the low shift 673-2 remains the limiting factor for the memory cell to be accurately sensed, the detriment to the high shift 672-2 will still allow the cell utilizing the balancing component to be accurately sensed for a greater quantity of time (e.g., time 678 instead of time 675, etc.).

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. An apparatus, comprising:

a sense amp connected to a first digit line and a second digit line; and a controller configured to:

apply a first activation signal to the first digit line at a first time during a compensation window associated with a sensing operation; and apply a second activation signal to the second digit line at a second time during the compensation window, wherein the first time and the second time have a time difference that corresponds to a threshold voltage difference between the first digit line and the second digit line.

2. The apparatus of claim 1, wherein the first digit line is a reference digit line and the second digit line is an active digit line.

3. The apparatus of claim 1, wherein the threshold voltage difference between the first digit line and the second digit line compensates for a memory cell and a word line coupled to the second digit line.

4. The apparatus of claim 1, wherein the threshold voltage difference is a difference between a first voltage of the first digit line and a second voltage of the second digit line.

5. The apparatus of claim 4, wherein the first voltage is greater than the second voltage to compensate for a memory cell and a word line coupled to the second digit line.

6. The apparatus of claim 1, wherein the sense amp is a differential sense amp.

7. The apparatus of claim 1, wherein the second digit line remains deactivated during the time difference between the first activation signal and the second activation signal.

8. The apparatus of claim 1, comprising a first isolation device that is connected to the first digit line and a second isolation device that is connected to the second digit line, wherein the first isolation device and second isolation device are deactivated during the compensation window and are activated upon completion of the compensation window.

9. The apparatus of claim 8, wherein the first isolation device is configured to provide a first voltage to the first digit line when activated and the second isolation device is configured to provide a second voltage to the second digit line when activated.

10. An apparatus, comprising:

a sense amp connected to a first digit line and a second digit line;

a first isolation device connected to the first digit line and configured to, in association with a sensing operation, receive a first activation signal at a first voltage; and a second isolation device connected to the second digit line and configured to, in association with the sensing operation, receive a second activation signal at a second voltage, wherein the first voltage is greater than the second voltage to provide a balancing effect for the sense amplifier by increasing a voltage on the first digit line as compared to the second digit line; and a controller configured to:

send the first activation signal to the first digit line at a first time during a compensation window when the first isolation device and the second isolation device are deactivated; and send the second activation signal to the second digit line at a second time during the compensation window, wherein the first time and the second time have a time difference that corresponds to a voltage threshold difference between the first digit line and the second digit line.

11. The apparatus of claim 10, wherein the threshold voltage difference is to compensate for a word line and a memory cell connected to the second digit line.

12. The apparatus of claim 10, wherein the first isolation device is connected to a first gate of a first transistor and the second isolation device is connected to a second gate of a second transistor.

13. The apparatus of claim 12, wherein a first drain of the first transistor is connected to the first digit line and a second drain of the second transistor is connected to the second digit line.

14. The apparatus of claim 10, wherein the first digit line is a reference digit line and the second digit line is an active digit line.

15. A method, comprising:

providing, by a controller, a first activation signal to a first digit line of a sense amp at a first time during a compensation window of the sense amp;

providing, by the controller, a second activation signal to a second digit line of the sense amp at a second time during the compensation window of the sense amp, wherein the first time and the second time have a time difference that corresponds to a first threshold voltage difference between the first digit line and the second digit line;

providing, by a first isolation device connected to the first digit line, a first voltage to the first digit line in response to an activation of the sense amp; and providing, by a second isolation device connected to the second digit line, a second voltage to the second digit line in response to the activation of the sense amp, wherein the first voltage is greater than the second voltage by a second threshold voltage difference.

16. The method of claim 15, further comprising determining that the first digit line is a reference digit line and the second digit line is an active digit line of the sense amp.

17. The method of claim 15, wherein the time difference between the first activation signal and the second activation signal provides a greater voltage to the first digit line than the second digit line.

18. The method of claim 15, wherein the first voltage provided by the first isolation device provides a greater voltage to the first digit line than the second voltage provided by the second isolation device to the second digit line.

* * * * *